(12) United States Patent
Chen et al.

(10) Patent No.: US 11,929,434 B2
(45) Date of Patent: Mar. 12, 2024

(54) HIGH VOLTAGE SWITCH DEVICE

(71) Applicant: eMemory Technology Inc., Hsin-Chu (TW)

(72) Inventors: Chih-Hsin Chen, Hsinchu County (TW); Shih-Chen Wang, Hsinchu County (TW); Tsung-Mu Lai, Hsinchu County (TW); Wen-Hao Ching, Hsinchu County (TW); Chun-Yuan Lo, Hsinchu County (TW); Wei-Chen Chang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 88 days.

(21) Appl. No.: 17/721,367

(22) Filed: Apr. 15, 2022

(65) Prior Publication Data
US 2022/0246758 A1 Aug. 4, 2022

Related U.S. Application Data

(62) Division of application No. 17/013,869, filed on Sep. 8, 2020, now Pat. No. 11,335,805.

(Continued)

(51) Int. Cl.
*H01L 29/78* (2006.01)
*H01L 29/06* (2006.01)
(Continued)

(52) U.S. Cl.
CPC ...... *H01L 29/7835* (2013.01); *H01L 29/0653* (2013.01); *H01L 29/0847* (2013.01); *H01L 29/1083* (2013.01)

(58) Field of Classification Search
CPC ............. H01L 29/7835; H01L 29/0653; H01L 29/0847; H01L 29/1083
See application file for complete search history.

(56) References Cited

U.S. PATENT DOCUMENTS 6,441,437 B1 8/2002 Gossner
6,750,489 B1 6/2004 Merrill
(Continued)

FOREIGN PATENT DOCUMENTS

| CN | 103311252 A | 9/2013 |
| CN | 104362149 A | 2/2015 |
| CN | 109742071 A | 5/2019 |

OTHER PUBLICATIONS

Jaeger, "Introduction to Microelectronic Fabrication", Modular Series on Solid State Devices, 1988, cover page, copyright page and pp. 49-53, vol. V.

*Primary Examiner* — Shih Tsun A Chou
(74) *Attorney, Agent, or Firm* — Winston Hsu

(57) ABSTRACT

A switch device includes a P-type substrate, a first gate structure, a first N-well, a shallow trench isolation structure, a first P-well, a second gate structure, a first N-type doped region, a second P-well, and a second N-type doped region. The first N-well is formed in the P-type substrate and partly under the first gate structure. The shallow trench isolation structure is formed in the first N-well and under the first gate structure. The first P-well is formed in the P-type substrate and under the first gate structure. The first N-type doped region is formed in the P-type substrate and between the first gate structure and the second gate structure. The second P-well is formed in the P-type substrate and under the second gate structure. The second N-type doped region is formed in the second P-well and partly under the second gate structure.

5 Claims, 6 Drawing Sheets

Related U.S. Application Data

(60) Provisional application No. 62/898,560, filed on Sep. 11, 2019.

(51) Int. Cl.
*H01L 29/08* (2006.01)
*H01L 29/10* (2006.01)

(56) References Cited

U.S. PATENT DOCUMENTS

| | | | |
|---|---|---|---|
| 6,876,035 B2 | 4/2005 | Abadeer | |
| 7,297,582 B2 | 11/2007 | Abadeer | |
| 7,307,319 B1 | 12/2007 | Chong | |
| 2006/0043491 A1 | 3/2006 | Lee | |
| 2008/0088994 A1 | 4/2008 | Lai | |
| 2008/0246080 A1 | 10/2008 | Ito | |
| 2010/0244106 A1* | 9/2010 | Parker | H01L 21/26513 257/E21.409 |
| 2011/0260798 A1 | 10/2011 | Kim | |
| 2013/0292841 A1* | 11/2013 | Lai | H01L 23/5283 257/E21.586 |
| 2014/0242763 A1* | 8/2014 | Chen | H01L 29/7881 438/197 |

\* cited by examiner

HIGH VOLTAGE SWITCH DEVICE

CROSS REFERENCE TO RELATED APPLICATIONS

This application is a division of U.S. application Ser. No. 17/013,869, filed on Sep. 8, 2020, which claims the benefit of U.S. Provisional Application No. 62/898,560, filed on Sep. 11, 2019. The contents of these applications are incorporated herein by reference.

BACKGROUND OF THE INVENTION

1. Field of the Invention

The present invention is related to a switch device, and more particularly, to a high voltage switch device.

2. Description of the Prior Art

Due to requirements of low power for electronic devices, the power specification of integrated circuits (IC) is redesigned to work in a low voltage environment for reducing power consumption. For example, the IC power specification that used to be 5V before is now reduced to 3.3V or even lower than 2V. In this case, components used in the low power IC are usually manufactured by a low voltage process to reduce cost.

However, the greater voltages are still inevitable in some circumstances. For example, the flash memory may require a greater voltage for programming or erasing. In this case, some of the components in the low power IC may have to be manufactured in a different process for enduring high voltages, which makes the manufacturing process complicated and lowers the yield.

SUMMARY OF THE INVENTION

One embodiment of the present invention discloses a switch device. The switch device includes a P-type substrate, a first gate structure, a first N-well, a shallow trench isolation structure, a first P-well, a second gate structure, a first N-type-doped region, a second P-well, and a second N-type doped region.

The first N-well is formed in the P-type substrate and partly under a first side of the first gate structure. The shallow trench isolation structure is formed in the first N-well and under the first side of the first gate structure. The first P-well is formed in the P-type substrate and under the first gate structure. The first N-type doped region is formed in the P-type substrate and between a second side of the first gate structure and a first side of the second gate structure. The second P-well is formed in the P-type substrate and under the second gate structure, and the second N-type doped region is formed in the second P-well and partly under the second gate structure.

Another embodiment of the present invention discloses a switch device. The switch device includes a substrate, a first gate structure, a first well of a first conduction type, a second gate structure, a second well of a second conduction type, a first doped region of the first conduction type, and a second doped region of the first conduction type.

The first well is formed in the substrate and partly under a first side of the first gate structure. The second well is formed in the substrate and under the first gate structure and the second gate structure. The first doped region is formed in the second well and between a second side of the first gate structure and a first side of the second gate structure. The second doped region is formed in the second well and adjacent to a second side of the second gate structure. The first conduction type and the second conduction type are of different doping polarity.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
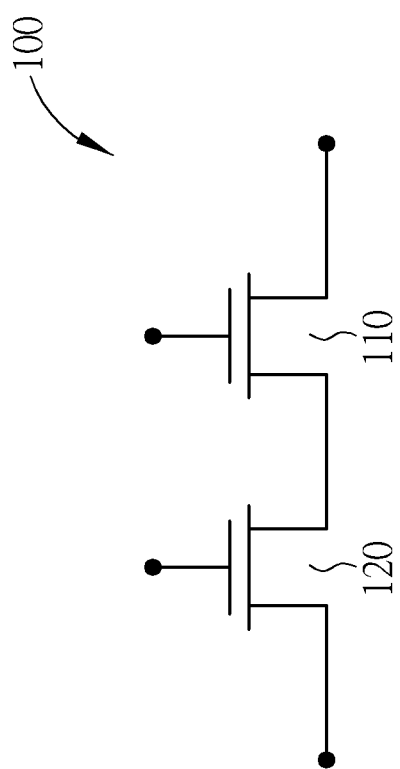
FIG. 1 shows a schematic diagram of a switch device according to one embodiment of the present invention.

FIG. 1 shows a schematic diagram of a switch device 100 according to one embodiment of the present invention. The switch device 100 includes a first transistor 110 and a second transistor 120.

The first transistor 110 has a first terminal, a second terminal, and a control terminal. The second transistor 120 has a first terminal, a second terminal coupled to the first terminal of the first transistor 110, and a control terminal.

Figure 2:
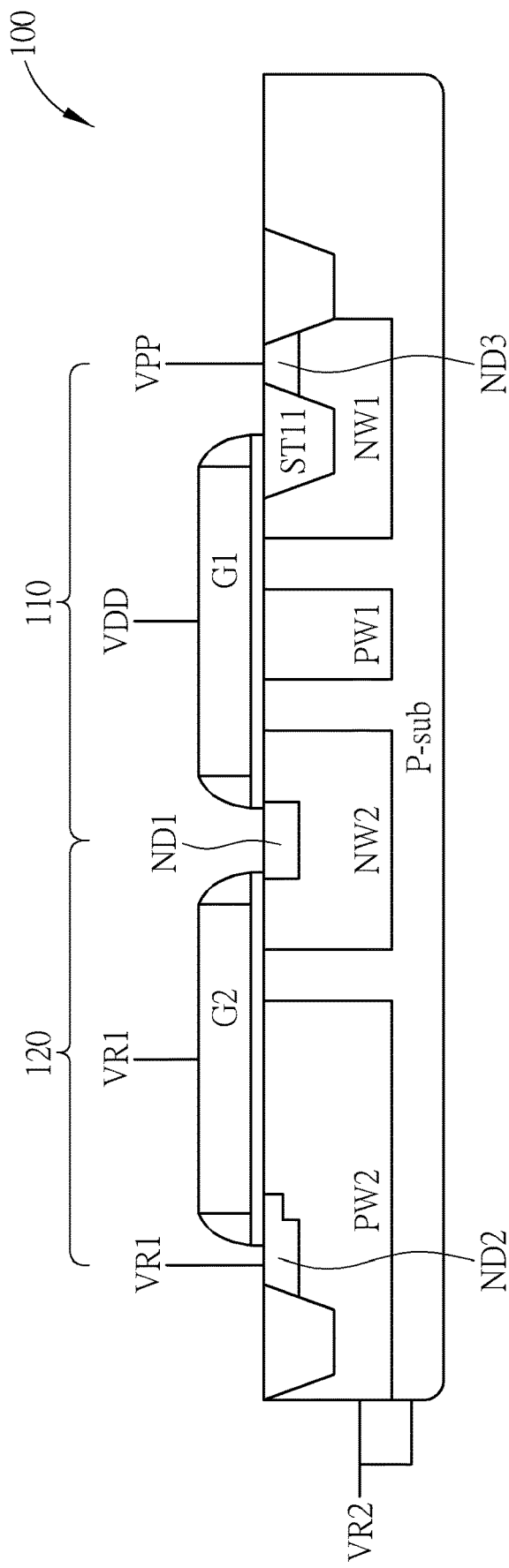
FIG. 2 shows a structure of the switch device in FIG. 1 according to one embodiment of the present invention.

FIG. 2 shows a structure of the switch device 100 according to one embodiment of the present invention. In some embodiments, the transistors 110 and 120 shown in FIG. 1 can be N-type transistors or P-type transistors; however, here the transistors 110 and 120 are elaborated as N-type transistors in FIG. 2. The switch device 100 includes a P-type substrate P-sub, a gate structure G1, an N-well NW1, a shallow trench isolation (STI) structure STI1, a P-well PW1, a gate structure G2, an N-type doped region ND1, a P-well PW2, and an N-type doped region ND2.

The N-well NW1 is formed in the P-type substrate P-sub and partly under a first side of the gate structure G1. The shallow trench isolation (STI) structure STI1 is formed in the N-well NW1 and under the first side of the gate structure G1. The P-well PW1 is formed in the P-type substrate P-sub and under the gate structure G1. In some embodiments, the P-well PW1 does not contact with the N-well NW1.

The N-type doped region ND1 is formed in the P-type substrate P-sub and between a second side of the gate structure G1 and a first side of the gate structure G2. The P-well PW2 is formed in the P-type substrate P-sub and under the gate structure G2. The N-type doped region ND2 is formed in the P-well PW2 and partly under the gate structure G2.

In some embodiments, the N-well NW1 can be seen as the second terminal (or the source/drain) of the first transistor 110, and the gate structure G1 can be seen as the control terminal (or the gate) of the first transistor 110. In FIG. 2, the switch device 100 can further include an N-type doped region ND3 as a coupling terminal of the drain of the first transistor 110. The N-type doped region ND3 can be formed in the N-well NW1 and adjacent to the shallow trench isolation structure STI1 without being covered by the gate structure G1.

In this case, due to the shallow trench isolation structure STI1, the current flowing from or to the second terminal of the first transistor 110 will need to take a detour along the N-well NW1. Since the doping concentration of the N-type doped region ND3 is greater than a doping concentration of the N-well NW1, the resistance of the N-well NW1 is greater than the N-type doped region ND3. Therefore, a longer current path with higher resistance would be formed by the N-well NW1 on the second terminal of the first transistor 110, thereby improving the high voltage capability of the first transistor 110. Furthermore, since the N-well NW1 is formed in the P-type substrate P-sub having a lower doping concentration than the P-well PW1, the junction breakdown voltage of the first transistor 110 can be increased. That is, the drain-source breakdown voltage (BVDSS) can be increased.

In some embodiments, the first terminal (or the source/drain) of the first transistor 110 and the second terminal (or the source/drain) of the second transistor 120 can be formed with the same N-type doped region ND1. Also, the N-type doped region ND2 can be seen as the first terminal (or the source/drain) of the second transistor 120, and the gate structure G2 can be seen as the control terminal (or the gate) of the second transistor 120.

In FIG. 2, the switch device 100 can further include an N-well NW2 formed in the P-type substrate P-sub, and the N-type doped region ND1 can be formed in the N-well NW2. In some embodiments, the doping concentration of the N-type doped region ND1 can be greater than the doping concentration of the N-well NW2. In FIG. 2, a first part of the N-well NW2 is under the gate structure G1, and a second part of the N-well NW2 is under the gate structure G2. Since the doping concentration of the N-well NW2 is lower than the doping concentration of the N-type doped region ND1, the junction breakdown voltage between the N-well NW2 and the P-type substrate P-sub would be higher, improving the durability of the first transistor 110 and the second transistor 120.

In FIG. 2, the switch device 100 is in a first state. In the first state, the N-type doped region ND2 and the gate structure G2 can receive a first reference voltage VR1. The gate structure G1 can receive a first operation voltage VDD, and the N-well NW1 can receive a second operation voltage VPP through the N-type doped region ND3. In some embodiments, the second operation voltage VPP can be greater than the first operation voltage VDD, and the first operation voltage VDD can be greater than the first reference voltage VR1. For example, the second operation voltage VPP can be the high voltage used to program the flash memory, the first operation voltage VDD can be the regular operation voltage in the system, and the reference voltage VR1 can be the ground voltage. Furthermore, the P-well PW1 and the P-well PW2 can receive a second reference voltage VR2, and the second reference voltage VR2 can be equal to or smaller than the first reference voltage VR1.

In this case, the channel under the gate structure G2 can be turned off, that is, the second transistor 120 can be turned off. In some embodiments, when the voltage difference between the two terminals of the switch device 100 is rather large, the gate-induced drain leakage (GIDL) current may be induced on the first transistor 110 and the second transistor 120. For example, in FIG. 2, since the second operation voltage VPP at the N-type doped region ND3 is rather large, the gate-induced drain leakage (GIDL) current may be induced if a rather low voltage, such as the first reference voltage VR1, is applied to the gate structure G1 directly to turn off the first transistor 110. However, since the gate structure G1 can receive the first operation voltage VDD while the gate structure G2 can receive the first reference voltage VR1, the gate to drain voltages of the two transistors 110 and 120 can be reduced, and, thus, the gate-induced drain leakage (GIDL) current can be suppressed.

Figure 3:
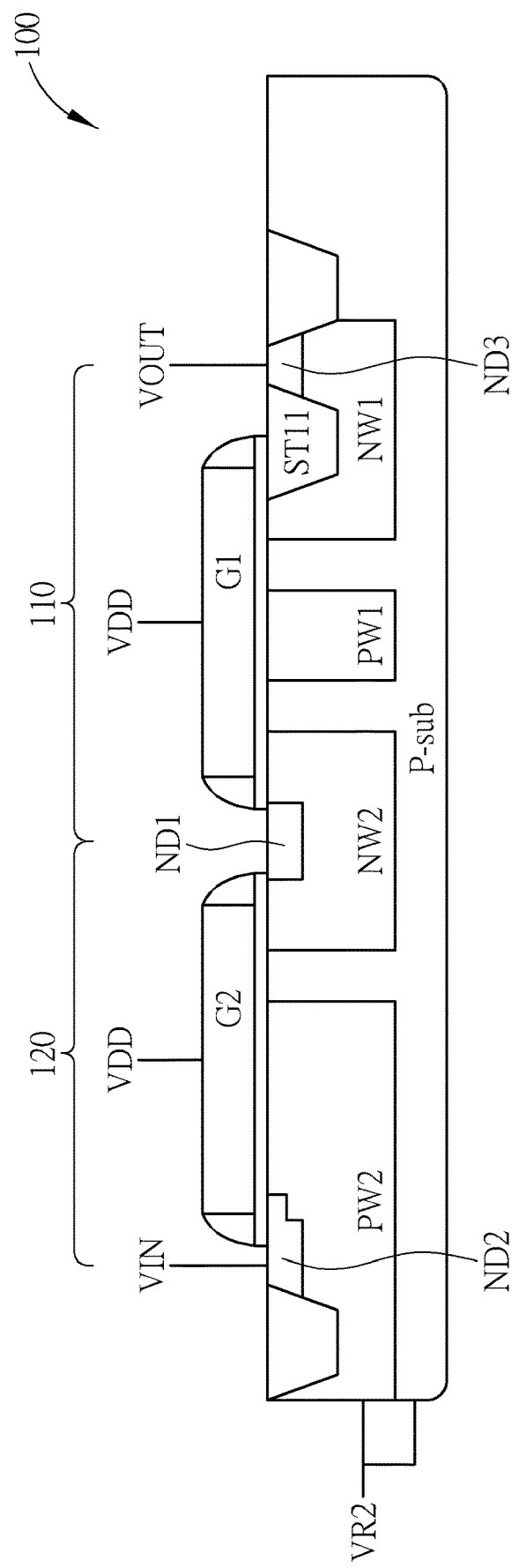
FIG. 3 shows the voltage received by the switch device in FIG. 1 when in a second state.

FIG. 3 shows the voltage received by the switch device 100 when in the second state. In FIG. 3, the N-type doped region ND2 can receive an input voltage VIN, and the gate structures G1 and G2 can receive the first operation voltage VDD. In some embodiments, the first operation voltage VDD can be greater than or equal to the input voltage VIN. Consequently, the first transistor 110 and the second transistor 120 can be turned on, and the second terminal of the transistor 110 can output the output voltage VOUT according to the input voltage VIN.

Furthermore, in some embodiments, when the switch device 100 is in the second state, the P-well PW1 and the P-well PW2 can receive the reference voltage VR2. That is, the body terminals of the first transistor 110 and the second transistor 120 can both receive the reference voltage VR2 to reduce the leakage current when the switch device 100 is in the second state.

In FIG. 1, the N-well NW1 can be formed in the P-type substrate P-sub directly, however, in some other embodiments, the N-well NW1 can be formed in a lightly doped P-well.

Figure 4:
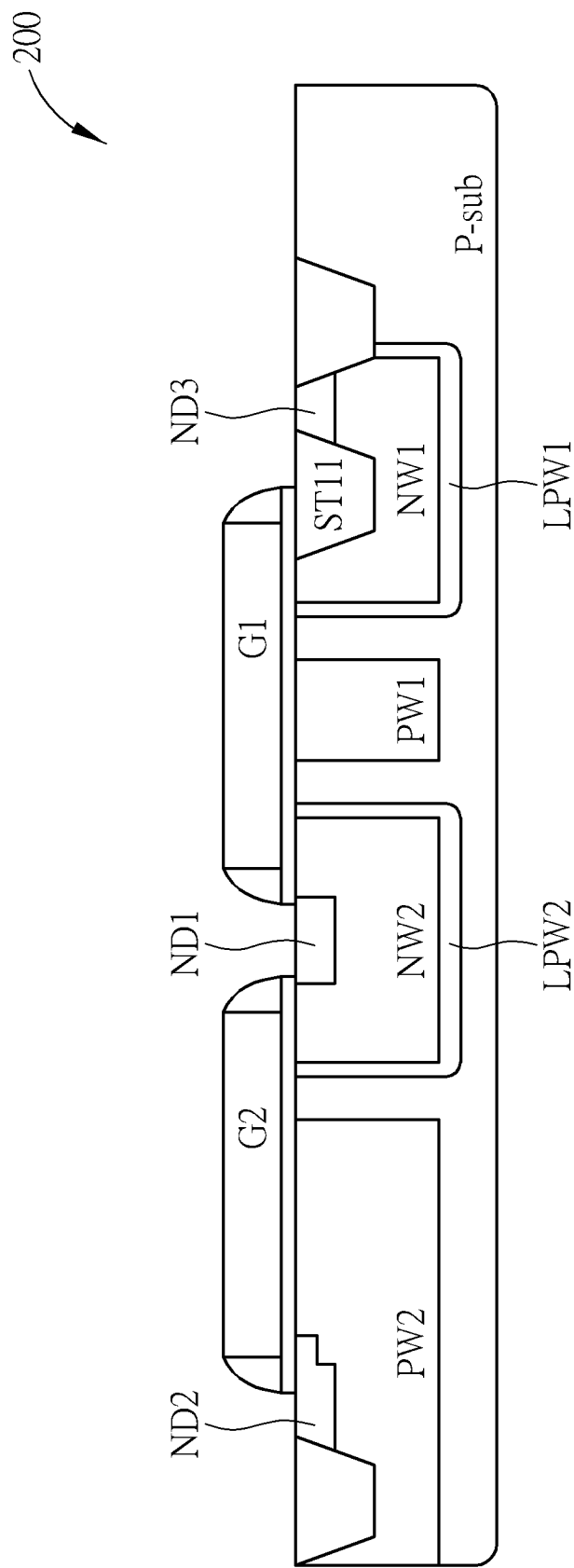
FIG. 4 shows a structure of a switch device according to another embodiment of the present invention.

FIG. 4 shows a structure of a switch device 200 according to one embodiment of the present invention. The switch device 200 and the switch device 100 have similar structures and can be operated with the same principles. However, the switch device 200 further includes lightly doped P-wells LPW1 and LPW2. The lightly doped P-well LPW1 can be formed in the P-type substrate P-sub, and the N-well NW1 can be formed in the lightly doped P-well LPW1. Also, the lightly doped P-well LPW2 can be formed in the P-type substrate P-sub, and the N-well NW2 can be formed in the lightly doped P-well LPW2.

In some embodiments, the doping concentration of the lightly doped P-well LPW1 can be smaller than the doping concentration of the P-well PW1. Also, the lightly doped P-well LPW1 can have a concentration gradient. For example, the doping concentration of the lightly doped P-well LPW1 can decrease from its boundary with the P-type substrate P-sub to its boundary with the N-well NW1, thus the lightly doped P-well LPW1 can have a smaller doping concentration near the N-well NW1.

Similarly, the doping concentration of the lightly doped P-well LPW2 can be smaller than the doping concentration of the P-well PW2, and the lightly doped P-well LPW2 can have a concentration gradient. For example, the doping concentration of the lightly doped P-well LPW2 can decrease from its boundary with the P-type substrate P-sub to its boundary with the N-well NW2, thus the lightly doped P-well LPW2 can have a smaller doping concentration near the N-well NW2.

In some embodiments, since the junction breakdown voltage between the lightly doped P-well LPW1 and the N-well NW1 and the junction breakdown voltage between the lightly doped P-well LPW2 and the N-well NW2 are rather large, the high voltage durability of the switch device 200 can be improved. Furthermore, since the switch devices 100 and 200 can be manufactured in a low voltage process, the integrated circuits can be designed with better flexibility.

Figure 5:
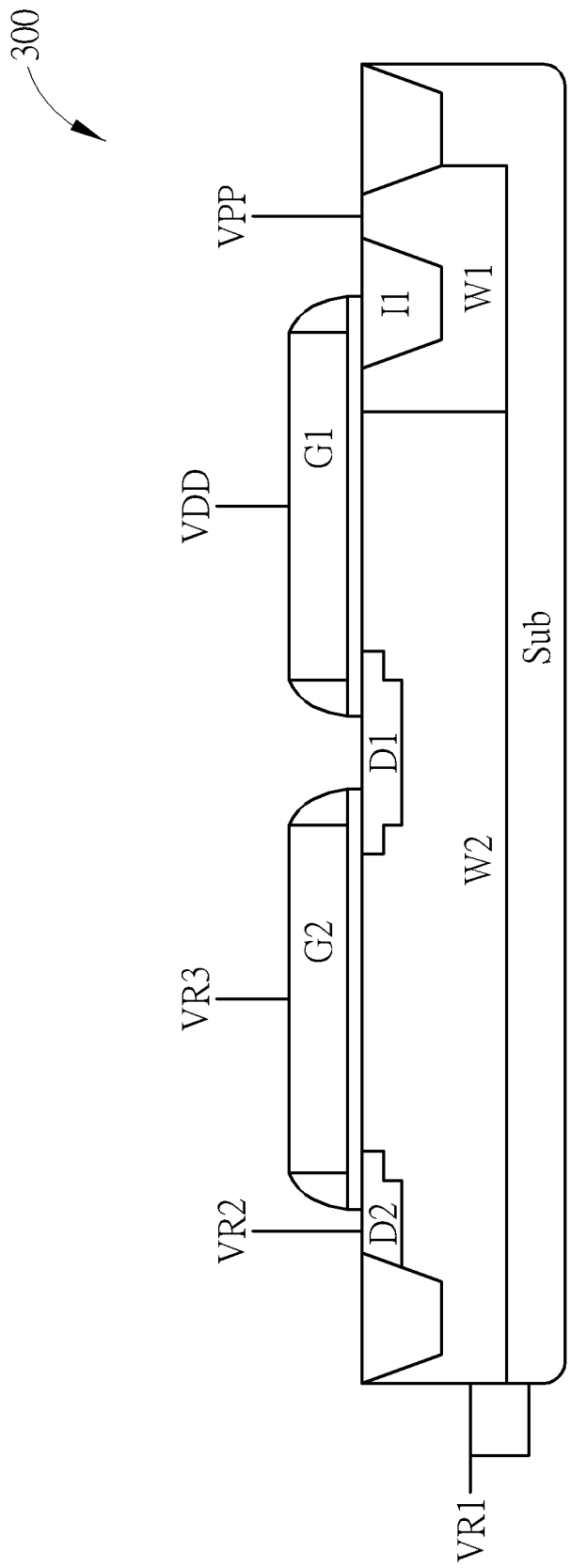
FIG. 5 shows a structure of a switch device according to another embodiment of the present invention.

Furthermore, in some embodiments, considering the electronic characteristics of the N-type doped regions ND1 and ND2 and the P-wells PW1 and PW2 in FIG. 2, the N-well NW2 of the switch device 100 shown in FIG. 2 may be omitted. FIG. 5 shows a structure of a switch device 300 according to one embodiment of the present invention. The switch device 300 and the switch device 100 have similar structures and can be operated with the same principles.

The switch device 300 includes a substrate Sub, a gate structure G1, a well W1 of a first conduction type, a gate structure G2, a well W2 of a second conduction type, a doped region D1 of the first conduction type, and a doped region D2 of the first conduction type.

The well W1 can be formed in the substrate Sub and partly under a first side of the gate structure G1. The well W2 can be formed in the substrate Sub and under the gate structures G1 and G2. The doped region D1 can be formed in the well W2, and between a second side of the gate structure G1 and a first side of the gate structure G2. The doped region D2 can be formed in the well W2 and adjacent to a second side of the gate structure G2. In some embodiments, the first conduction type and the second conduction type are of different doping polarity. For example, the first conduction type can be N-type, and the second conduction type can be P-type. In this case, the substrate Sub can be P-type substrate.

In FIG. 5, the switch device 300 can further include an isolation structure I1 filled with dielectric material, the isolation structure I1 can be formed in the well W1 and under the first side of the gate structure G1 so the current flowing from or to the second terminal of the first transistor 110 will need to take a detour along the well W1. Therefore, a longer current path with higher resistance would be formed by the well W1 on the second terminal of the first transistor 110, thereby improving the high voltage capability of the first transistor 110.

FIG. 5 further shows the voltages received by the switch device 300 when the switch device 300 is in the first state. In FIG. 5, the substrate Sub and the well W2 can receive a first reference voltage VR1, the doped region D2 can receive a second reference voltage VR2, the gate structure G2 can receive a third reference voltage VR3, the gate structure G1 can receive a first operation voltage VDD, and the well W1 can receive a second operation voltage VPP.

In some embodiments, an absolute value of a voltage drop between the second operation voltage VPP and the first reference voltage VR1 can be greater than an absolute value of a voltage drop between the first operation voltage VDD and the first reference voltage VR1. Also, the absolute value of the voltage drop between the first operation voltage VDD and the first reference voltage VR1 can be greater than or equal to an absolute value of a voltage drop between the third reference voltage VR3 and the first reference voltage VR1, and the absolute value of the voltage drop between the third reference voltage VR3 and the first reference voltage VR1 can be greater than or equal to an absolute value of a voltage drop between the second reference voltage VR2 and the first reference voltage VR1. The absolute value of the voltage drop between the second reference voltage VR2 and the first reference voltage VR1 can be greater than or equal to zero. In this case, the well W1 and the substrate Sub can be reverse biased, and the channel under the gate structure and G2 can be turned off, that is, the second transistor 120 can be turned off.

Furthermore, since the gate structure G1 can receive the first operation voltage VDD while the gate structure G2 can receive the third reference voltage VR3, the gate to drain voltage can be reduced, and, thus, the gate-induced drain leakage (GIDL) current on the first transistor 110 and the second transistor 120 can be suppressed.

Figure 6:
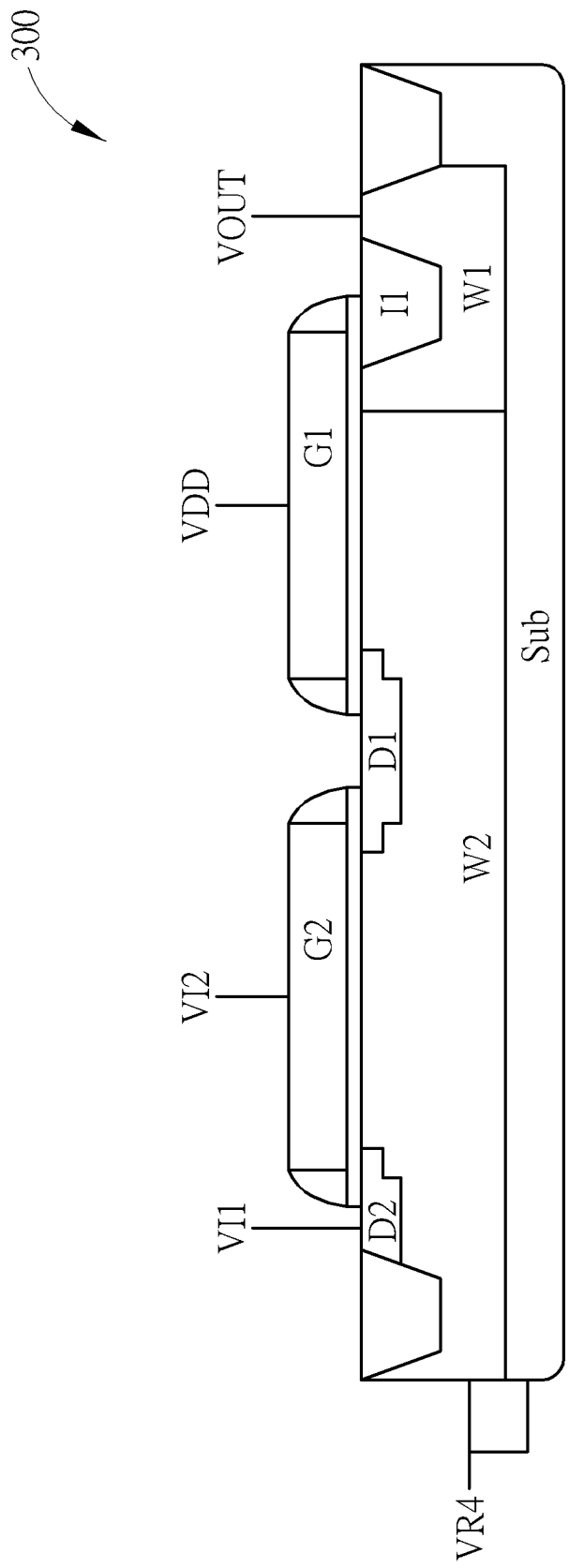
FIG. 6 shows the voltage received by the switch device in FIG. 5 when in a second state.

FIG. 6 shows the voltages received by the switch device 300 when the switch device 300 is in a second state. In FIG. 6, the well W2 can receive a fourth reference voltage VR4, the doped region D2 can receive a first input voltage VI1, the gate structure G2 can receive a second input voltage VI2, and the gate structure G1 can receive the first operation voltage VDD. In some embodiments, an absolute value of a voltage drop between the second input voltage VI2 and the fourth reference voltage VR4 and an absolute value of a voltage drop between the first operation voltage VDD and the fourth reference voltage VR4 are greater than an absolute value of a voltage drop between the first input voltage VI1 and the fourth reference voltage VR4. Furthermore, the absolute value of the voltage drop between the first input voltage VI1 and the fourth reference voltage VR4 can be greater than or equal to zero. In this case, the channels under the gate structures G1 and G2 can be turned on, that is, the first transistor 110 and the second transistor 120 can be turned on.

In summary, the switch devices provided by the embodiments of the present invention can include two transistors for improving the high voltage durability. Furthermore, by implementing the source/drain of the transistor with an N-well and a shallow trench isolation structure, the junction breakdown voltage of the transistor can be increased, thereby allowing the switch device to be operated under high voltage conditions while no high voltage manufacturing process is required.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch device, comprising:
   a substrate;
   a first gate structure;
   a first well of a first conduction type formed in the substrate and partly under a first side of the first gate structure;
   a second gate structure;
   a second well of a second conduction type formed in the substrate and under the first gate structure and the second gate structure;
   a first doped region of the first conduction type formed in the second well and between a second side of the first gate structure and a first side of the second gate structure; and
   a second doped region of the first conduction type formed in the second well and adjacent to a second side of the second gate structure;
   wherein the first conduction type and the second conduction type are of different doping polarity;
   wherein when the switch device is in a first state:
   the substrate and the second well receive a first reference voltage;
   the second doped region receives a second reference voltage;
   the second gate structure receives a third reference voltage;
   the first gate structure receives a first operation voltage; and
   the first well receives a second operation voltage; and wherein an absolute value of a first voltage drop between the second operation voltage and the first reference voltage is greater than an absolute value of a second voltage drop between the first operation voltage and the first reference voltage, the absolute value of the second voltage drop is greater than or equal to an absolute value of a third voltage drop between the third reference voltage and the first reference voltage, the absolute value of the third voltage drop is greater than or equal to an absolute value of a fourth voltage drop between the second reference voltage and the first reference voltage, and the absolute value of the fourth voltage drop is greater than or equal to zero.

2. The switch device of claim 1, further comprising:
an isolation structure filled with dielectric material formed in the first well and under the first side of the first gate structure.

3. The switch device of claim 1, wherein:
when the switch device is in the first state, a channel under the second gate is turned off.

4. A switch device, comprising:
a substrate;
a first gate structure;
a first well of a first conduction type formed in the substrate and partly under a first side of the first gate structure;
a second gate structure;
a second well of a second conduction type formed in the substrate and under the first gate structure and the second gate structure;
a first doped region of the first conduction type formed in the second well and between a second side of the first gate structure and a first side of the second gate structure; and
a second doped region of the first conduction type formed in the second well and adjacent to a second side of the second gate structure;
wherein the first conduction type and the second conduction type are of different doping polarity;
wherein when the switch device is in a second state:
the second well receives a fourth reference voltage;
the second doped region receives a first input voltage;
the second gate structure receives a second input voltage; and
the first gate structure receives an operation voltage; and
wherein an absolute value of a fifth voltage drop between the second input voltage and the fourth reference voltage and an absolute value of a sixth voltage drop between the operation voltage and the fourth reference voltage are greater than an absolute value of a seventh voltage drop between the first input voltage and the fourth reference voltage, and the absolute value of the seventh voltage drop is greater than or equal to zero.

5. The switch device of claim 4, wherein:
when the switch device is in the second state, channels under the first gate and the second gate are turned on.

* * * * *